(12) United States Patent
Barnes et al.

(10) Patent No.: US 6,373,312 B1
(45) Date of Patent: Apr. 16, 2002

(54) PRECISION, HIGH SPEED DELAY SYSTEM FOR PROVIDING DELAYED CLOCK EDGES WITH NEW DELAY VALUES EVERY CLOCK PERIOD

(75) Inventors: Robert K. Barnes, Ft. Collins; Randy L. Bailey, Fort Collins, both of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/672,030

(22) Filed: Sep. 29, 2000

(51) Int. Cl.[7] ............................................... H03H 11/26
(52) U.S. Cl. ...................... 327/261; 327/276
(58) Field of Search .................. 327/172, 176, 327/261–264, 269–271, 276–278, 284, 285, 291–294, 299, 393, 395

(56) References Cited

U.S. PATENT DOCUMENTS

| | | | |
|---|---|---|---|
| 4,657,406 A | * 4/1987 | Yaeda ........................ 368/120 |
| 5,148,175 A | * 9/1992 | Woolfolk ...................... 342/95 |
| 5,457,719 A | 10/1995 | Guo et al. ................... 375/373 |
| 5,488,325 A | 1/1996 | Sato et al. ................... 327/286 |
| 5,532,633 A | 7/1996 | Kawai .......................... 327/174 |
| 5,554,946 A | 9/1996 | Curran et al. ............... 327/172 |
| 5,589,788 A | * 12/1996 | Goto ........................... 327/276 |
| 5,619,148 A | * 4/1997 | Guo .............................. 327/3 |
| 5,654,988 A | 8/1997 | Heyward et al. ........... 375/355 |
| 5,690,114 A | * 11/1997 | Chiang et al. ......... 128/660.07 |
| 5,719,516 A | 2/1998 | Sharpe-Geisler ............ 327/291 |
| 5,760,609 A | 6/1998 | Sharpe-Geisler ............. 326/93 |
| 5,999,023 A | 12/1999 | Kim ............................ 327/144 |
| 6,072,348 A | 6/2000 | New et al. ................... 327/295 |
| 6,223,313 B1 | 4/2001 | How et al. ................... 714/724 |

* cited by examiner

Primary Examiner—My-Trang Nu Ton (57) ABSTRACT

A precision delay system allowing clock edges to be delayed with new delay values every clock period T. The internal delay elements are reprogrammed every clock cycle with reprogramming transients suppressed by clock independent blanking circuitry. The system allows the use of delay elements with a maximum delay of one-half (T/2) the clock period to continuously span a full clock cycle T delay range with full cycle-by-cycle reprogramming.

22 Claims, 13 Drawing Sheets

PRIOR ART

FIG.4

PRIOR ART

PRIOR ART

PRECISION, HIGH SPEED DELAY SYSTEM FOR PROVIDING DELAYED CLOCK EDGES WITH NEW DELAY VALUES EVERY CLOCK PERIOD

FIELD OF THE INVENTION

The present invention relates to an apparatus and method for providing delayed clock edges with new delay values every clock period for use in loading delay data.

BACKGROUND OF THE INVENTION

Timing on the fly (TOF) solutions have used delay update schemes that feature the following. One feature involves initiating output enable in a system clock domain. This feature allows for simple communication between a core integrated circuit (IC) and a corresponding delay line control section, where new delay data is loaded into delay lines on the "off-edge" of the input to the delay lines. Although a workable solution, important processing time is consumed for the "off edge" to arrive to allow the new data to be loaded.

In conventional TOF systems, no provisions exist for "blanking out" transients caused by reprogramming the delay lines. The use of the restrictive core clock domain control identified above, severely restricts the use of techniques to blank reprogramming transients when delay values are changed every input clock cycle.

TOF systems have also featured using twice the number of delay lines so that one delay line is used every other cycle. This methodology allows one delay line to be operational while the other is being reprogrammed. However, it requires additional delay lines, which increases the TOF complexity and IC chip space.

Accordingly, a need exists for improvements in providing delayed clock edges for use in loading delay data.

SUMMARY OF THE INVENTION

A circuit consistent with the present invention provides split fine and coarse delay control of delay lines for use in loading delay data. It includes a fine delay, controlled by a fine delay line, receiving a clock signal and outputting a fine delay signal. A coarse delay, controlled by a coarse delay line, receives the fine delay signal and outputs a coarse delay signal. Gating logic receives the coarse delay signal and outputs a gated delay signal for loading delay data.

A polarity blanking delay circuit consistent with the present invention provides for blanking transients for use in loading delay data. It includes a delay, controlled by a delay line, receiving a clock signal and outputting a first delay signal. A latch, clocked by the first delay signal, receives a particular input signal and outputs a second delay signal. A blanking circuit receives the clock signal and a control signal, and it outputs a blanking signal to a control input of the latch for use in blanking transients in the first delay signal.

A circuit consistent with the present invention provides adjustable blanking of transients for use during loading of delay data. It includes a fine delay receiving a clock signal and outputting a fine delay signal. A coarse delay, controlled by a coarse delay line, receives the fine delay signal and outputs a coarse delay signal. A latch, clocked by the coarse delay signal, receives a particular input signal and outputs a delayed clock signal. A blanking generator receives a control signal and outputs an adjustable blanking signal to a control terminal of the latch for use in blanking transients in the delayed clock signal.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Overview

A TOF solution consistent with the present invention solves the following limitations associated with implementing a high speed reprogrammable delay line for IC tester or other applications. With the TOF solution, implementing delay lines, the key parameter being delayed is a single edge, either rising or falling, often referred to as the "golden" edge. Timing control in the TOF solution uses first-in-first-out memory circuits (FIFOs) to control delay lines in multiple clock domains, eliminating timing restrictions by allowing multiple delay lines to be placed on a single IC chip without regard to clock signal skew issues. Updated delay data is reprogrammed into the delay lines as soon as the "golden" edge exits the particular delay line, which saves time when operating at higher frequencies. The use of independently blanked fine and coarse delay lines prevents erroneous output edges as a result of transients during reprogramming. The TOF solution also allows a precision, high speed delay line to be updated every clock cycle without the existence of false delay edges.

Figure 1:
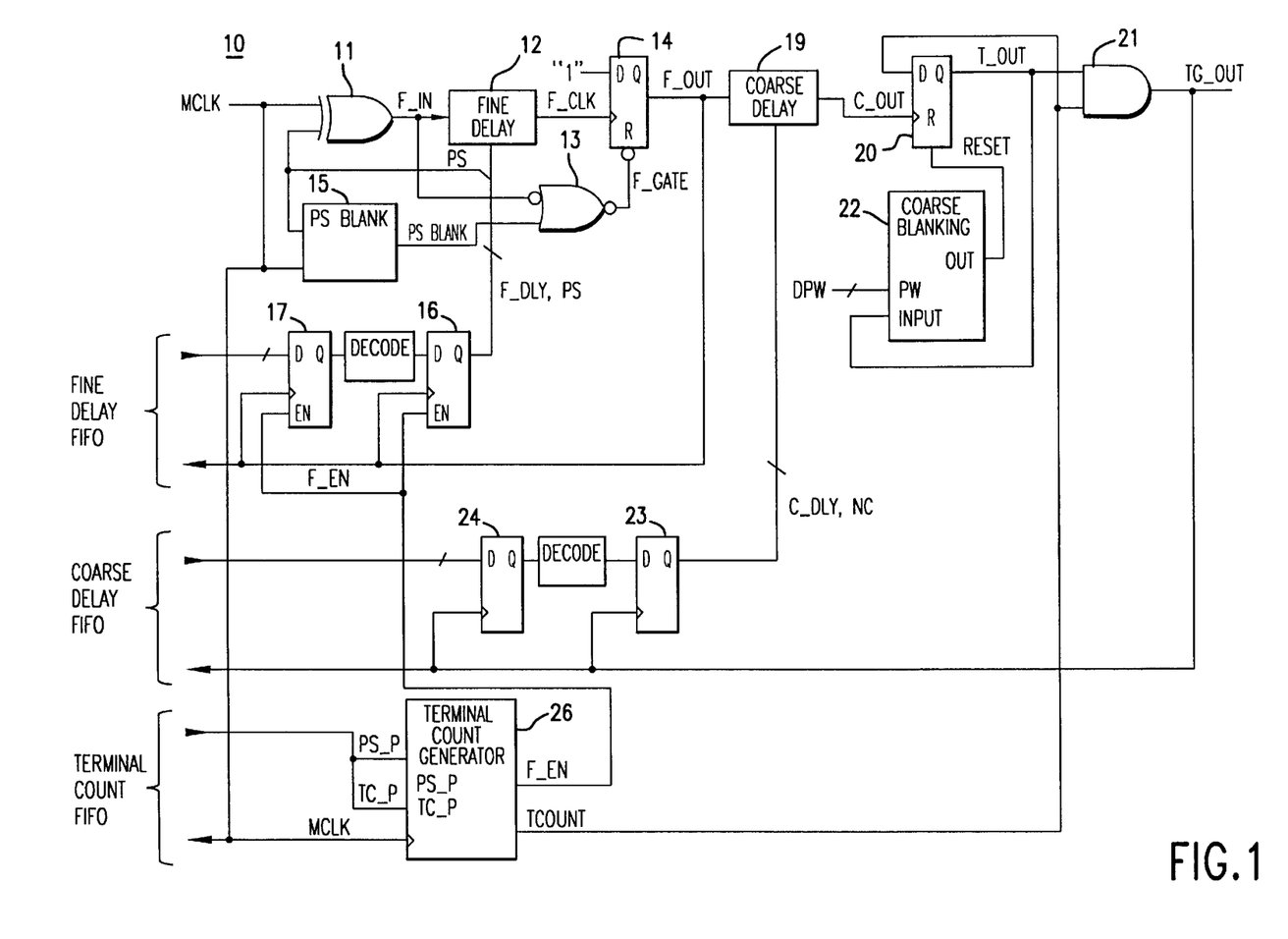
FIG. 1 is a diagram of a TOF timing generator.

Referring to FIG. 1, a timing generator 10, implementing a TOF generation circuit, includes two separately controlled fine and coarse delays as well as an output gating circuit. The fine and coarse delays operate on the rising edge (the "golden" edge). All three sections of TOF circuit 10 communicate to a core digital domain via FIFOs. An input master clock (MCLK) of period "T" is of the same origin and frequency (1/T) as the core clock, but of unknown phase with respect to the core clock. The fine and coarse delay lines combine to create a maximum delay of T/2 with an additional T/2 delay created by changing the input phase via an exclusive-OR gate. The delay line operates continuously every clock cycle, but will only output a delayed edge when the output gating circuit is enabled. In this way, the delay line is able to delay an edge for "N1" clock cycles plus a fractional delay "d1" for a total delay of: $D_{TOTAL}=N1*T+d1$. In addition, the output gating stage prevents delay updates until the clock cycle of interest arrives, in particular, the clock cycle where an output edge occurs on signal TG_OUT.

Figure 2:
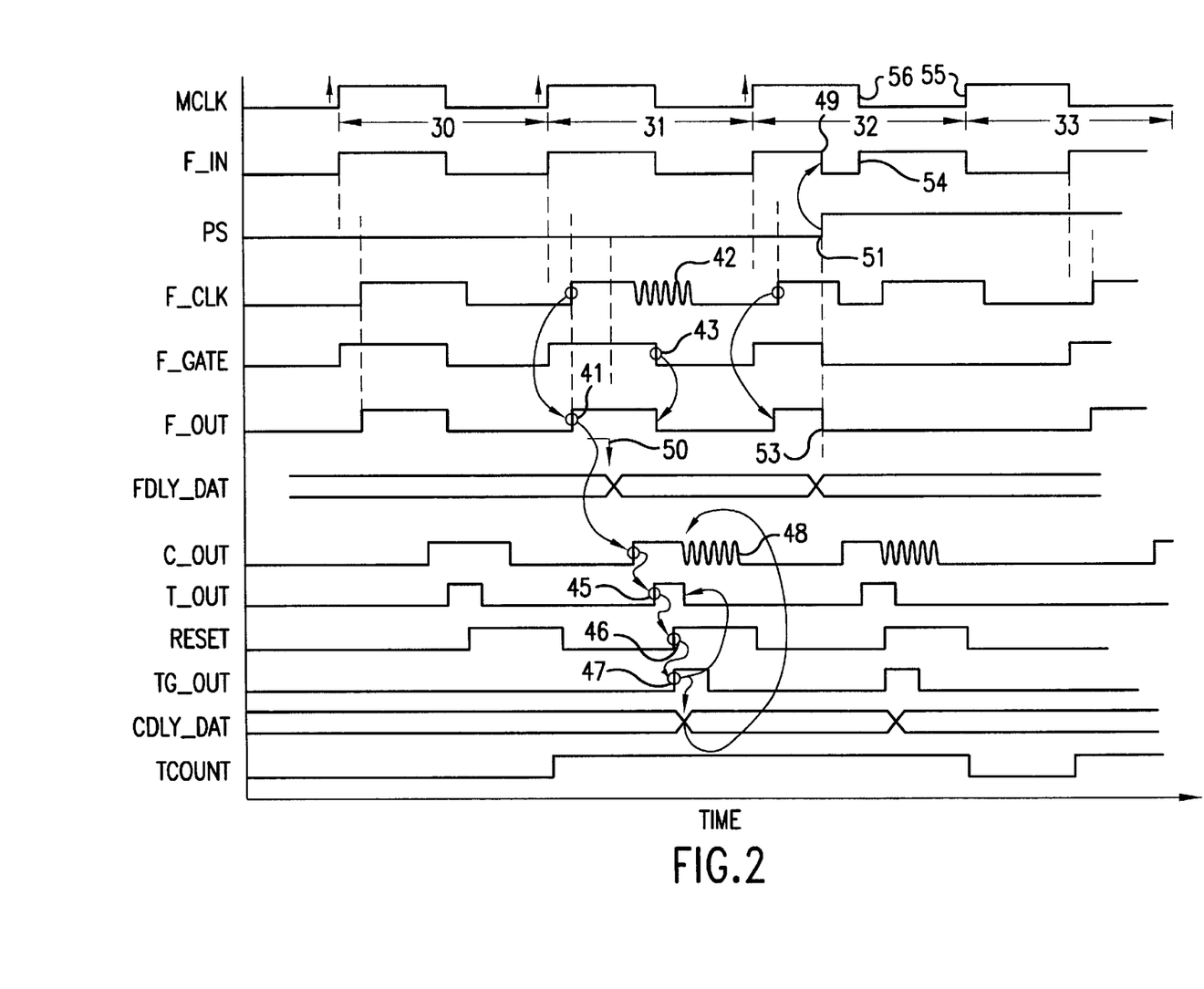
FIG. 2 is a timing diagram for the timing generator shown in FIG. 1.

Referring to both FIG. 1, timing generator 10, and FIG. 2, the timing generator timing diagram, the following describes the operation of timing generator 10. Master clock MCLK is the reference clock for the timing generator output (TG_OUT). This clock has a 50% duty cycle. For illustrative purposes, the clock is broken into cycles 30, 31, 32, and 33 in the timing diagram. The "up arrows" in cycles 30–33 denote that the output delay is based on the rising edge of MCLK. Cycle 33 delay is based on the falling edge of MCLK and adds an additional T/2 delay to the output edge.

Cycle 30 illustrates a non-output cycle for timing generator 10. In this cycle, the internal delay circuits function, but output TG_OUT is not gated out, nor are new delay values programmed into the fine and coarse delay lines. The continuous operation of the internal delay circuits helps to maintain a constant internal temperature within an IC containing timing generator 10 to help minimize delay variation.

Considering cycle 31, the clock-to-output sequence can be traced. Rising signal MCLK passes through an exclusive-OR gate 11 and exits as signal F_IN of the same polarity. Signal F_IN is transmitted to a fine delay 12 where it is delayed by the amount programmed by fine delay control bits. Signal F_IN is also applied to a NOR gate 13 and passes out as signal F_GATE. Note that signal PSBLANK is low at this time and F_GATE is a copy, less gate delays, of signal F_IN. Signal F_GATE, now going high, will take a D-type flip-flop (DFF) 14 out of reset and enable it to clock a logic 1 (high) onto its "Q" output.

After the delayed signal F_IN exits fine delay line 12 as signal F_CLK, its rising edge clocks the high signal on its "D" input to the "Q" output as signal F_OUT (point 41) on FIG. 2. The rising edge of signal F_OUT is applied to both a coarse delay 19 and a fine delay register stage 16 and 17, and the clock input of the fine delay FIFO. At this time, the rising edge data is propagating through the coarse delay line and new delay data is being loaded into the fine delay line (point 50 in FIG. 2).

Fine delay 12 and coarse delay 19, as well as the fine delays and coarse delays identified below, are implemented with programmable delay lines. The fine and coarse delays receive an input signal and output a delayed version of the input signal based upon a received programmable control signal, in this case a digital control value. The delayed version of the signal is referred to as a fine delay signal as output from the fine delay, a coarse delay signal as output from the coarse delay, or a delay signal as output from either. The programmability results from being able to change the digital control value, and that value is proportional to the amount of time delay produced. The fine delay provides more finely-tuned delayed versions of the input signal, meaning shorter time delays than the coarse delay. In general, the maximum delay value for the fine delay results in the delay spanning one coarse delay value. Alternatively, any type of component for providing a delayed version of a signal can be used.

The reprogramming of the fine delay line can create signal transients (point 42 in FIG. 2). The transients initially have no effect on DFF 14 output since it can only clock out a logic high, and its output is already high. The falling edge of signal F_IN ends up as a falling edge on signal F_GATE (point 43 in FIG. 2), which forces the DFF output F_OUT low. Signal F_GATE remaining low maintains signal F_OUT low even though reprogramming transients may exist on signal F_CLK. Signal F_GATE will remain low until the next rising edge on signal F_IN. The combined intrinsic delay of the fine delay, delay register reload time, and transient settle time is such that all transients will normally have dissipated at the start of the next rising edge of F_IN. Thus, the fine delay section of timing generator 10 is self blanking by having effectively eliminated the transients and is normally guaranteed to not develop erroneous outputs due to delay reprogramming transients.

After the specified delay, the delayed edge exits coarse delay line 19 as signal C_OUT. Signal C_OUT is applied to a coarse DFF 20. At this time, signal TCOUNT from a terminal count generator 26 is high, enabling coarse DFF 20 and allowing an output in this MCLK cycle. The rising C_OUT signal clocks signal T_OUT high (point 45 in FIG. 2) and is applied to an output NAND gate 21 and a coarse blanking circuit 22. Coarse blanking circuit 22 generates signal RESET (point 46 in FIG. 2). This high-going signal is applied to coarse DFF 20, forcing its output low. Coarse DFF 20 remains in RESET for a programmed length of time as controlled by coarse blanking circuit 22. The length of time must be long enough to prevent the coarse delay reloading transients (point 48 in FIG. 2) from clocking an output from coarse DFF 20.

Due to the longer delay range associated with the coarse delay line of approximately T/2, the blanking of reprogramming transients cannot in this example be based on the master clock MCLK or its derivatives. Coarse blanking circuit 22 contains a programmable pulse width generator that allows the blanking pulse width of signal RESET to be set to prevent coarse delay reloading transients from generating an erroneous output. A digital bus DPW controls the pulse width of signal RESET.

The high TCOUNT signal (because this MCLK cycle will create an output) gates signal T_OUT out of an AND gate 21 as output timing edge TG_OUT. Edge TG_OUT is applied to the external destination circuit as well as to the clock input of coarse delay registers 23 and 24. The delay data to the coarse delay line is now updated (point 47 in FIG. 2) and can result in coarse delay reprogramming transients (point 48 in FIG. 2). The coarse transients are effectively blanked by the RESET signal applied to coarse DFF 20. At the end of the blanking period, signal RESET is low and DFF 20 is ready for the next rising edge of C_OUT.

Cycle 32 illustrates the condition of an MCLK phase change. In this situation, timing generator 10 is now based on the falling edge of MCLK, adding an additional time of T/2 to its delay range. As stated above, the fine and coarse delay lines 12 and 19 both operate on the rising edge. The T/2 phase switch is accomplished with exclusive-OR gate 11 to invert the MCLK signal when signal phase select (PS) is asserted. For the phase change, the output of fine DFF 14 is applied to coarse delay line 19 and to fine delay registers 16 and 17. The new fine delay data is changed (point 53 in FIG. 2) at this time. Signal PS is part of the fine data and also changes from a low to a high value at this time (point 51 in FIG. 2).

The high-going signal PS causes exclusive-OR gate 11 to invert its output signal F_IN, which immediately goes low (point 49 in FIG. 2). Signal PS is also applied to a PS blanking circuit 15, which forces signal PSBLANK high. The high PSBLANK signal immediately forces signal F_GATE low, forcing F_OUT low. PS blanking circuit 15 maintains signal PSBLANK high until the next rising edge of MCLK (point 55 in FIG. 2). In this manner, the "wrong" rising edge on F_IN (point 54 in FIG. 2) is prevented from generating a fine delay output.

The expected operation of timing generator 10 requires for its output consecutive edges spaced no closer than period T. This expected operation requires that the MCLK edge labeled point 56 in FIG. 2 cannot generate a timing edge. Thus, PS blanking circuit 15 maintains this expected operation and additionally prevents reprogramming and phase select transients from exiting fine delay 12. The final result is that for phase select (PS) changes, fine delay 12 automatically prevents erroneous transients from exiting fine delay 12. The lack of fine delay transients means the coarse delay requires no special circuits to accommodate phase select changes. As a result of the phase select change, timing generator 10 will operates as described above. The only difference is that signal F_IN is now 180° out of phase with respect to master clock MCLK.

Split Fine and Coarse Delay Reprogramming Control

An embodiment consistent with the present invention includes a circuit providing split fine and coarse delay reprogramming control independently initiated by the output of each separate delay line. This embodiment avoids limitations with respect to delay reprogramming settle times in high speed TOF circuits.

Figure 3:
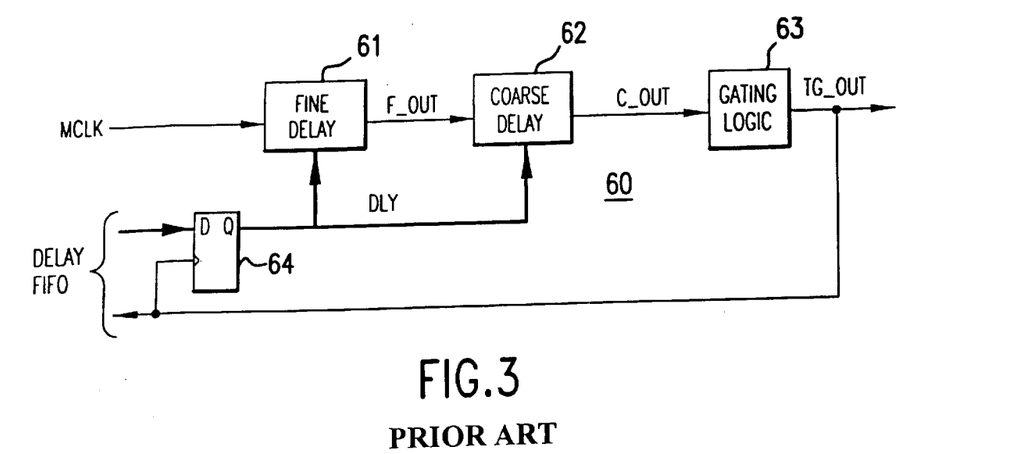
FIG. 3 is a diagram of a conventional clock delay system.
Figure 4:
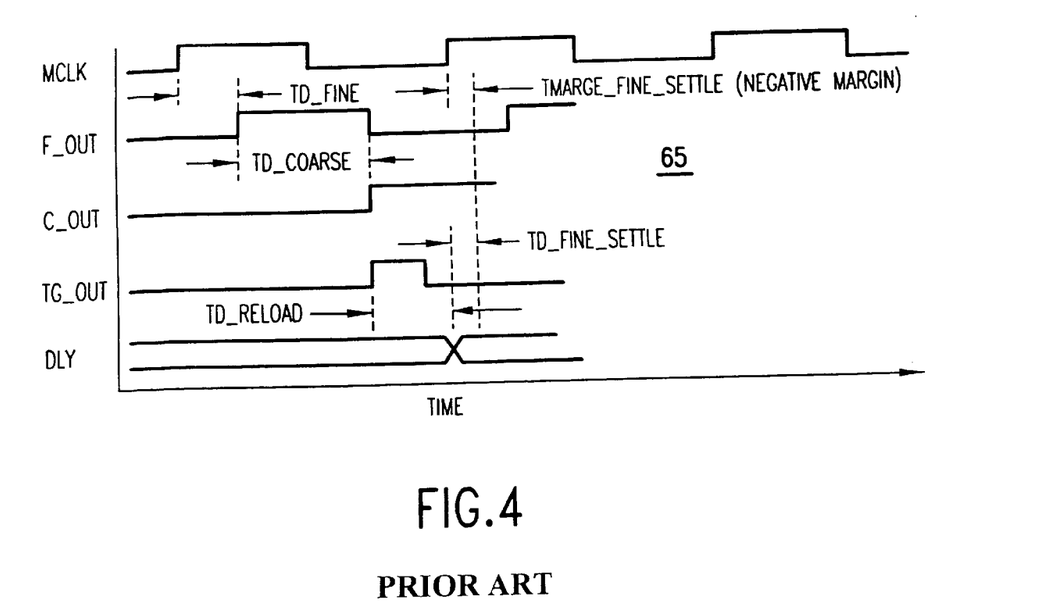
FIG. 4 is a timing diagram for the clock delay system shown in FIG. 3.

FIG. 3 shows exemplary use of previous styles of TOF methodology in a circuit 60 having a fine delay 61 producing a fine delay signal F_OUT, a coarse delay 62 producing a coarse delay signal C_OUT, gating logic 63, and a DFF 64. In this example, gating logic 63 includes, as shown and configured in FIG. 1, latch 20, AND gate 21, and coarse blanking circuit 22. In FIG. 3, the "next cycle" delay value is not updated until after the delayed edge exits the circuit. The corresponding timing diagram 65 in FIG. 4 illustrates the limitation with previous designs such as is shown in FIG. 3. The timing diagram assumes the typical values for delay parameters and the worst case situation of maximum coarse delay as provided in Table 1.

TABLE 1

TD_fine = 0.2T (approximate intrinsic + average fine delay through fine delay)
TD_coarse = 0.5T (approximate intrinsic + max coarse delay through coarse delay)
TD_reload = 0.3T (approximate data re-load delay path delay)
TD_fine_settle = 0.1T (estimated time for fine delay line to settle)

A limitation with previous implementations is that the fine delay is not fully settled with the new delay value before the next MCLK edge arrives. The following calculations provided in Table 2 help to illustrate the limitation.

TABLE 2

(1) T_fine_settle = TD_fine + TD_coarse + TD_reload + TD_fine_settle
(2)     = 1.1T TABLE 2-continued (3) Tmarg_fine_settle = T - T_fine_settle
(4)     = T - 1.1T = −0.1T Equations (1) and (2) show that it takes more than one period (T) for the fine delay to settle. The resulting fine settle margin (Tmarg_fine_settle) is reduced to a negative number in equation (4), indicating no margin. Therefore, this conventional implementation can result in erroneous delay values.

Figure 5:
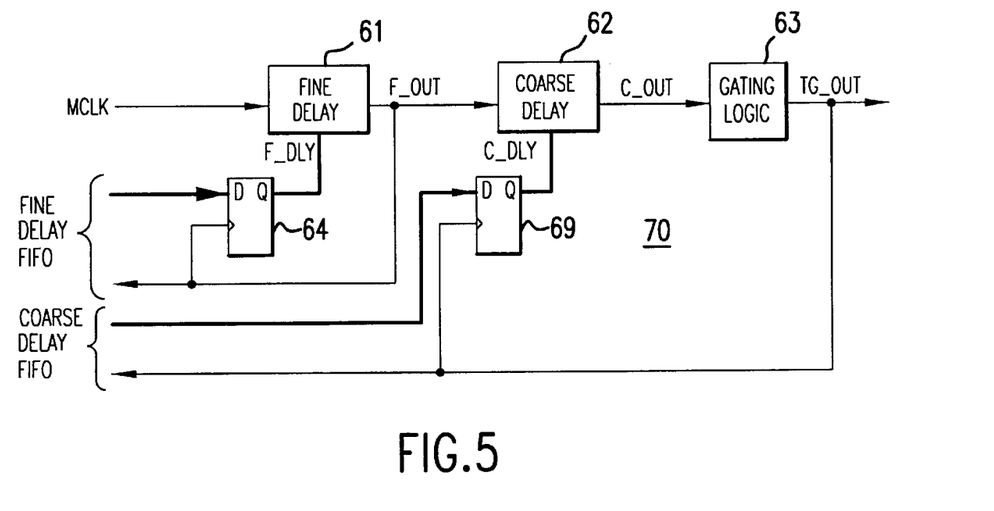
FIG. 5 is a diagram of an improved clock delay system.

FIG. 5 shows an improved circuit 70 having a coarse delay FIFO 69 for solving the lack of fine delay line reprogramming margin. In FIG. 5, the output of the fine delay line is also routed to a fine delay data register 64 clock input. As soon as the output edge exits fine delay register 61, the delay reprogramming for the fine delay line is initiated.

Figure 6:
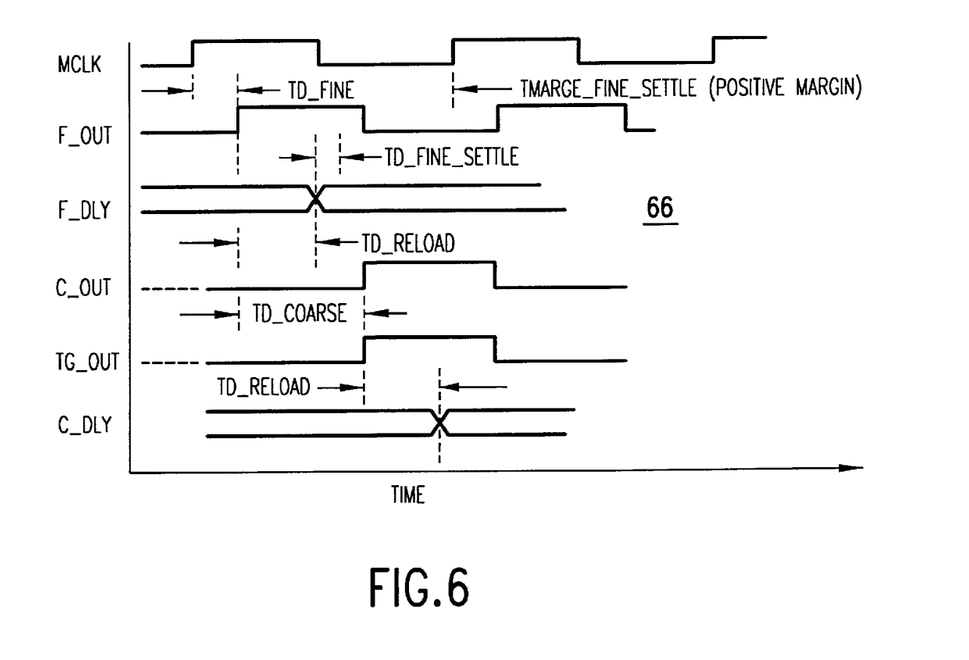
FIG. 6 is a timing diagram for the clock delay system shown in FIG. 5.

FIG. 6 shows a simplified timing diagram 66 for circuit 70. Using the same delay assumptions discussed above, the fine delay reloading margin is calculated as follows in Table 3.

TABLE 3

(5) Tmarg_fine_settle = T - (TD_fine + TD_reload + Tdfine_settle)
(6)     = T - (0.2T + 0.3T + 0.1T)
(7)     = 0.4T Equation (7) demonstrates an improvement in the T_marg_fine settle value of 0.5T over the original configuration of FIG. 3.

Self-Blanking Reprogrammable Delay Circuit

Another embodiment consistent with the present invention includes a polarity change insensitive self-blanking reprogrammable delay circuit control that automatically inhibits erroneous output edges during input clock polarity changes and delay line delay changes. This embodiment allows "on the fly" polarity changes and delay changes in high clock speed environments. This embodiment includes two features that allow it to both self-blank delay reprogramming transients and input polarity changes. These features are explained below.

First Feature: Self Blanking of Programming Transients

Figure 7:
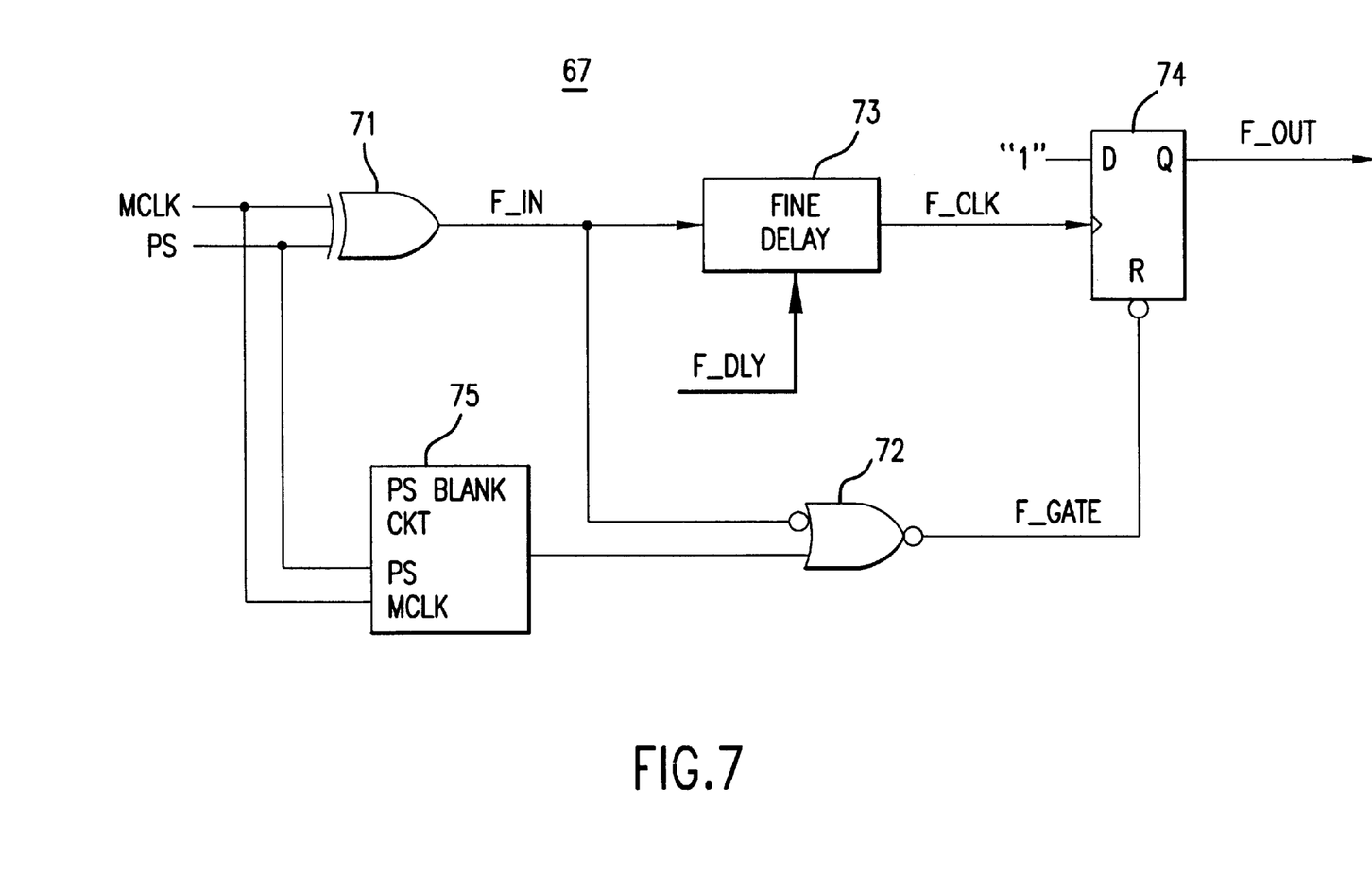
FIG. 7 is a diagram of a polarity blanking circuit.
Figure 8:
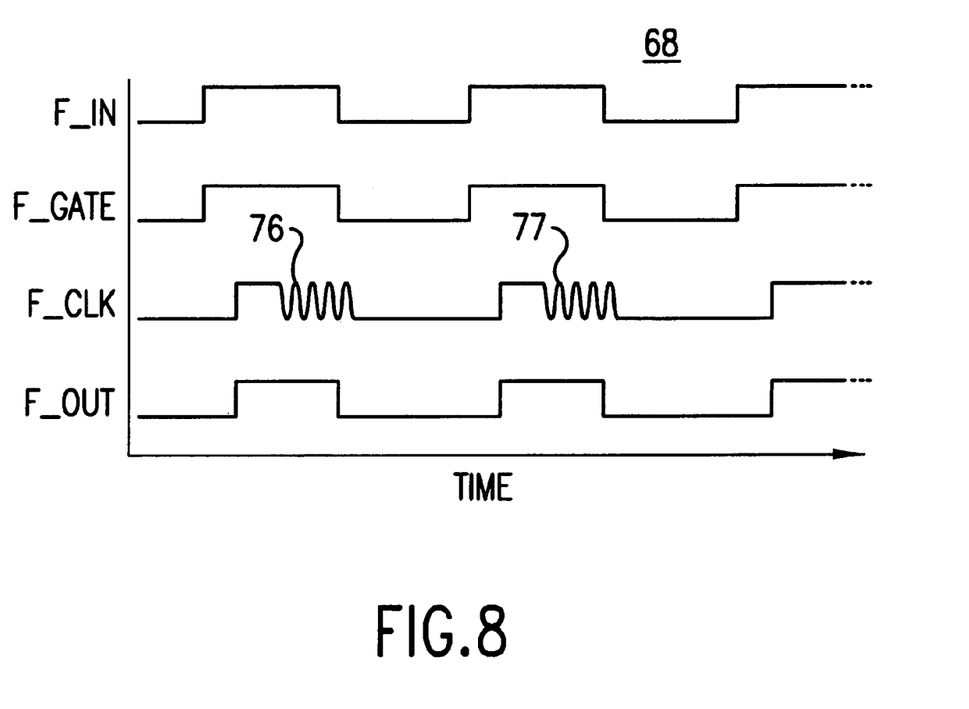
FIG. 8 is a timing diagram for self blanking.

For this embodiment, the delay line reprogramming transient settle time is less than the input clock period (T). FIG. 7 illustrates a self blanking circuit 67 having an exclusive-OR gate 71, a NOR gate 72, a fine delay 73 producing a delayed clock signal F_CLK, a DFF 74, and a PS blank circuit 75 producing a blanking signal. FIG. 8 shows a simplified timing diagram 68 for circuit 67.

Referring to FIG. 7, the delay line input F_IN is gated via NOR gate 72 as signal F_GATE. With signal F_IN initially low, signal F_GATE also remains low, maintaining DFF 74 in a RESET state. During the RESET state of DFF 74, its output (F_OUT) remains low, regardless of a state of signal F_CLK. When signal F_IN rises, it starts propagating through the delay line and also causes signal F_GATE to rise. A high F_GATE signal allows DFF 74 to output a rising edge on the next rising edge of the delay line output F_CLK.

The intrinsic fine delay, the minimum propagation time through the fine delay line, is greater than the delay path from signals F_IN to F_GATE for this embodiment. The RESET disable to rising edge of F_CLK signal setup time is negligible, or when combined with the F_IN to F_GATE signal delay, is still less than the fine delay line intrinsic delay. This assumption implies that when the rising edge of signal F_CLK rises, DFF 74 will be fully out of its reset state and ready to clock out a rising edge.

After the delayed edge (F_CLK) from the fine delay line clocks out a rising edge on F_OUT, the new delay value will be updated following some predictable logic delay. The resulting reprogramming of the fine delay line can generate transients at the delay line outputs (see FIG. 8, points 76 and 77). FIG. 8 illustrates that, although F_CLK may toggle, DFF 74 remains high due to its fixed high "D" input. At some point, signal F_IN followed by signal F_GATE will go low. The low-going signal F_GATE will force DFF 74 output signal F_OUT low. Signal F_OUT will remain low, even in the presence of transients on signal F_CLK. This assumption requires that all programming transients have settled long before the next rising edge of signal F_IN. Along with signal F_IN rising, signal F_GATE rises and re-enables DFF 74.

The resulting implementation for this feature automatically suppresses reprogramming transients without the use, for example, of complicated external blanking circuits.

Second Feature: Polarity Change Blanking

Polarity change blanking prevents input polarity changes from generating erroneous fine delay circuit output edges. The fine and coarse delay lines provide a maximum delay of T/2, with an additional T/2 delay achieved by changing the phase (180°) of the input clock. This changing of the input clock phase in real-time can create erroneous delay line outputs if not properly inhibited.

Figure 9:
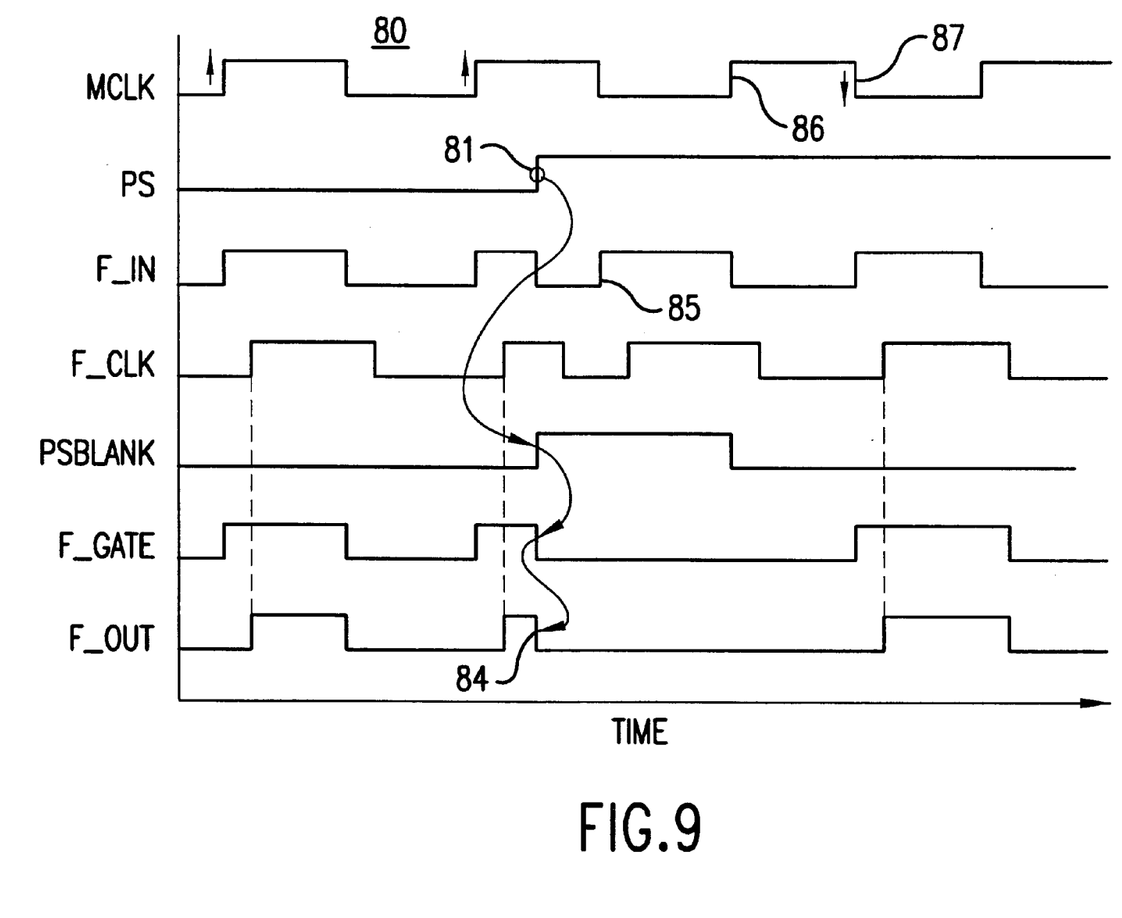
FIG. 9 is a timing diagram for polarity blanking.

Circuit 67 shown in FIG. 7 and a corresponding timing diagram 80 shown in FIG. 9 illustrate the operation circuit 67 for polarity blanking. When the phase select signal PS changes as shown by point 81, signal F_IN immediately goes low. Signal PS is applied to a PS blank circuit 75, where it forces output signal PSBLANK high. The high-going PSBLANK signal forces signal F_GATE low, causing DFF 74 signal F_OUT output to go low as shown by point 84. A smaller pulse width on signal F_OUT at point 84 does not affect the delay output since all timing information is contained in the rising edge of signal F_OUT. Signal PSBLANK remains high until one MCLK clock edge before the next valid falling MCLK edge, point 86. At this time, signal F_IN is now low, which further maintains a DFF 74 in a reset state until signal F_IN goes high as caused by MCLK falling, shown as point 87.

The above sequence serves to maintain the fine DFF low, and prevent the false rising FCLK edge at point 85 from creating an erroneous fine delay output when the input polarity changes. A similar sequence of events occurs when the PS signal changes from a high to low value. An additional feature of the polarity change blanking circuit is that it simultaneously blanks any reprogramming transients that may occur during polarity changes.

Figure 10:
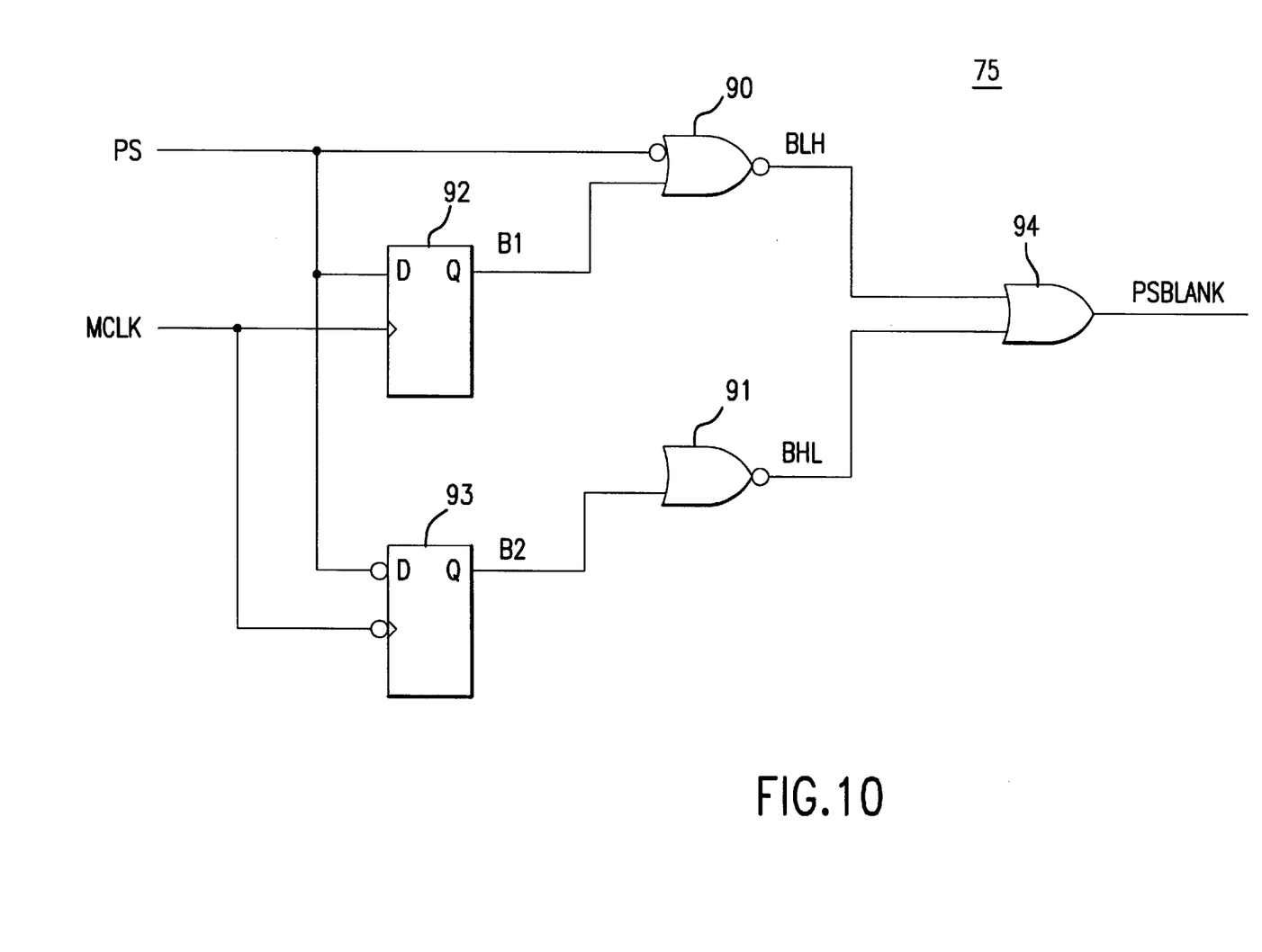
FIG. 10 is a diagram of a blank circuit for the polarity blanking circuit shown in FIG. 7.

PS blank circuit 75 includes a simple synchronous state machine clocked by MCLK with outputs gated by signal PS, as shown in FIG. 10. It includes latches 92 and 93 clocked by a clock signal MCLK and gated by a control signal PS. Latches 92 and 93 are connected to NOR gates 90 and 91, providing input signals to an OR gate 94, which produces the blanking signal.

Adjustable Asynchronous Blanking Circuit

Another embodiment consistent with the present invention includes an adjustable, asynchronous blanking circuit that provides adjustable and precise blanking control independent of delay line delay setting, and eliminates delay line reprogramming transients in a large delay line with delay range of approximately one-half clock period. This embodiment works without reference to the external master clock.

Figure 11:
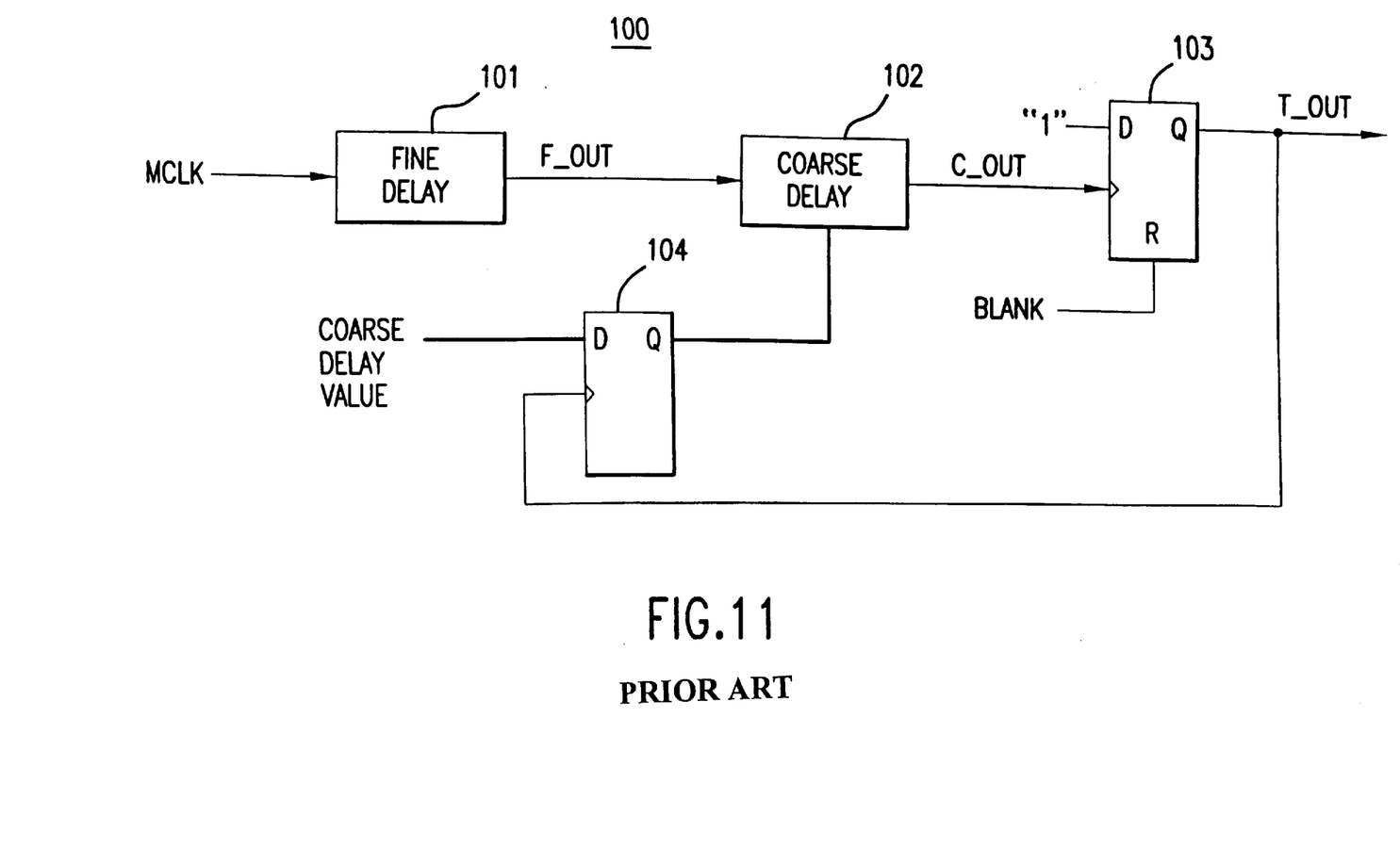
FIG. 11 is a diagram of a conventional coarse delay circuit.
Figure 12:
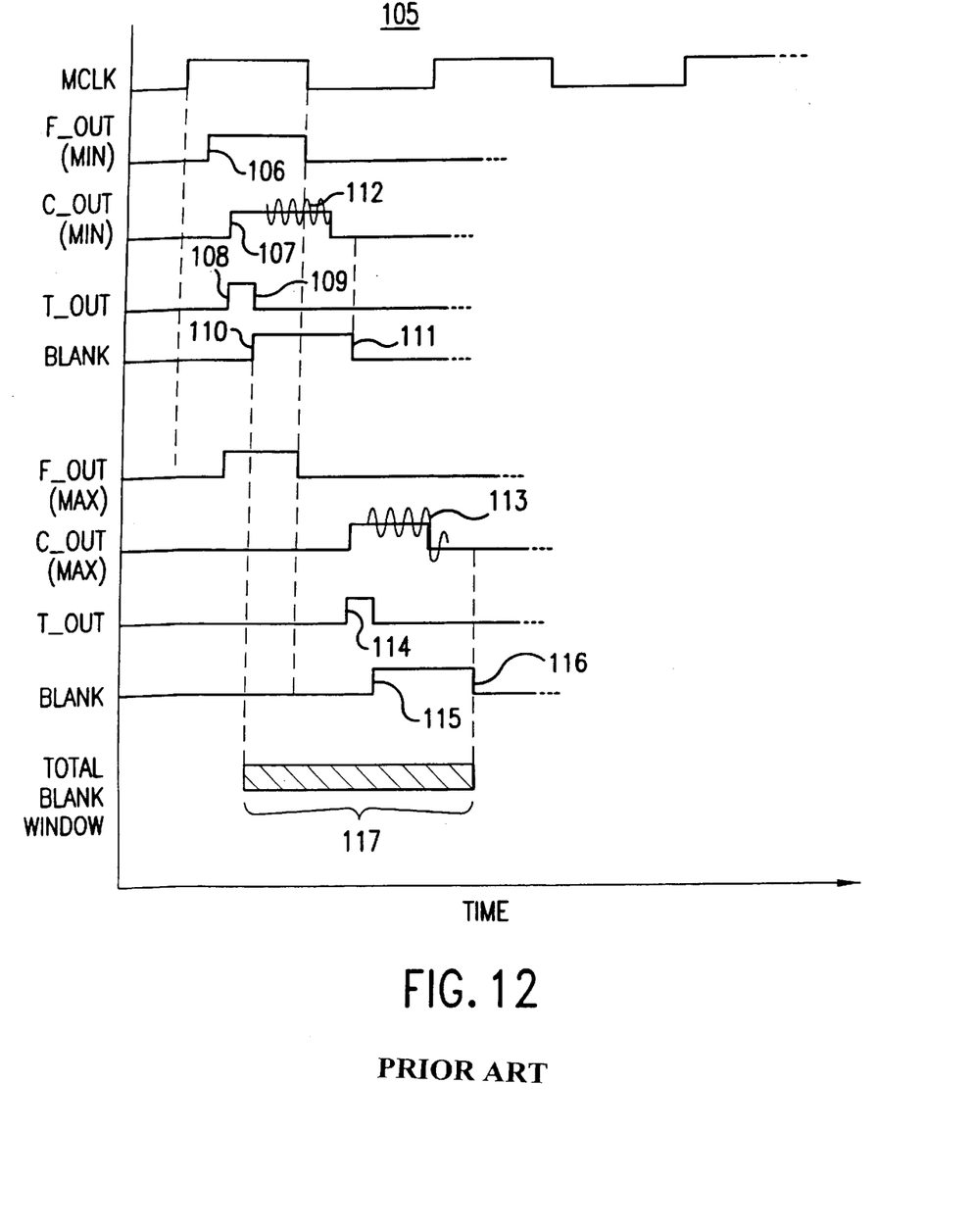
FIG. 12 is a timing diagram for the coarse delay circuit shown in FIG. 11.

FIG. 11 shows a conventional timing generator 100, and FIG. 12 shows a timing diagram 105 for its operation. Timing generator 100 includes a fine delay 101 producing a fine delay signal F_OUT, a coarse delay 102 producing a coarse delay signal C_OUT, a DFF 103, and a DFF 104. It is assumed the coarse delay line needs to be blanked for slightly less than T/2 to sufficiently suppress any programming transients. However, the length (Δdelay~T/2) of the coarse delay line in timing generator 100 creates limitations when attempting to blank out reprogramming transients 112 and 113 shown in timing diagram 105. A coarse delay blanking circuit consistent with the present invention solves this limitation of correctly blanking reprogramming transients when the programmed delay can vary over a range of approximately T/2.

Referring to FIG. 12, the top section details the blanking requirements when the fine and coarse delays are set to minimum. Fine delay output edge F_OUT at point 106 is delayed by the minimum value through the delay line and enters the coarse delay (see coarse delay 102 in FIG. 11). After the programmed coarse delay value, the rising coarse edge at point 107 clocks a logic one (high) out as signal T_OUT 108. Signal T_OUT also initiates the delay line reprogramming process to load the delay value required for the next output edge. Some fixed time later, the coarse delay line is reloaded and reloading transients may exist for slightly less than the delay line length, as shown by transient 112.

An equivalent blanking pulse, "BLANK" in FIG. 12, would extend from points 110 to 111. It is assumed that this BLANK signal will have some internal circuit delays before it is initially asserted, as shown by the delay from edges 108 to 110. The rising edge of the BLANK signal forces the DFF output T_OUT low at edge 109. The BLANK signal continues to maintain the DFF output low during the time of the reloading transients. The case for maximum fine and coarse delay is given in the bottom half of FIG. 12. In this scenario, the required blanking pulse (BLANK) would have to extend from point 115 to 116.

The total blank window 117 demonstrates the entire range of the blanking pulse to successfully blank out minimum and maximum delay ranges. The BLANK pulse is always initiated with respect to the reprogramming of the coarse delay line. The reprogramming of the coarse delay line is based on the delayed coarse delay output rising edge (T_OUT), as shown at points 108 and 114. The required position of the BLANK signal has no fixed reference to input master clock signal MCLK; its starting point is based on the rising edge of T_OUT. Without alternative methods, the blanking of the coarse delay line reloading transients cannot be accomplished by this conventional method, such as using the master clock signal as a timing reference.

Figure 13:
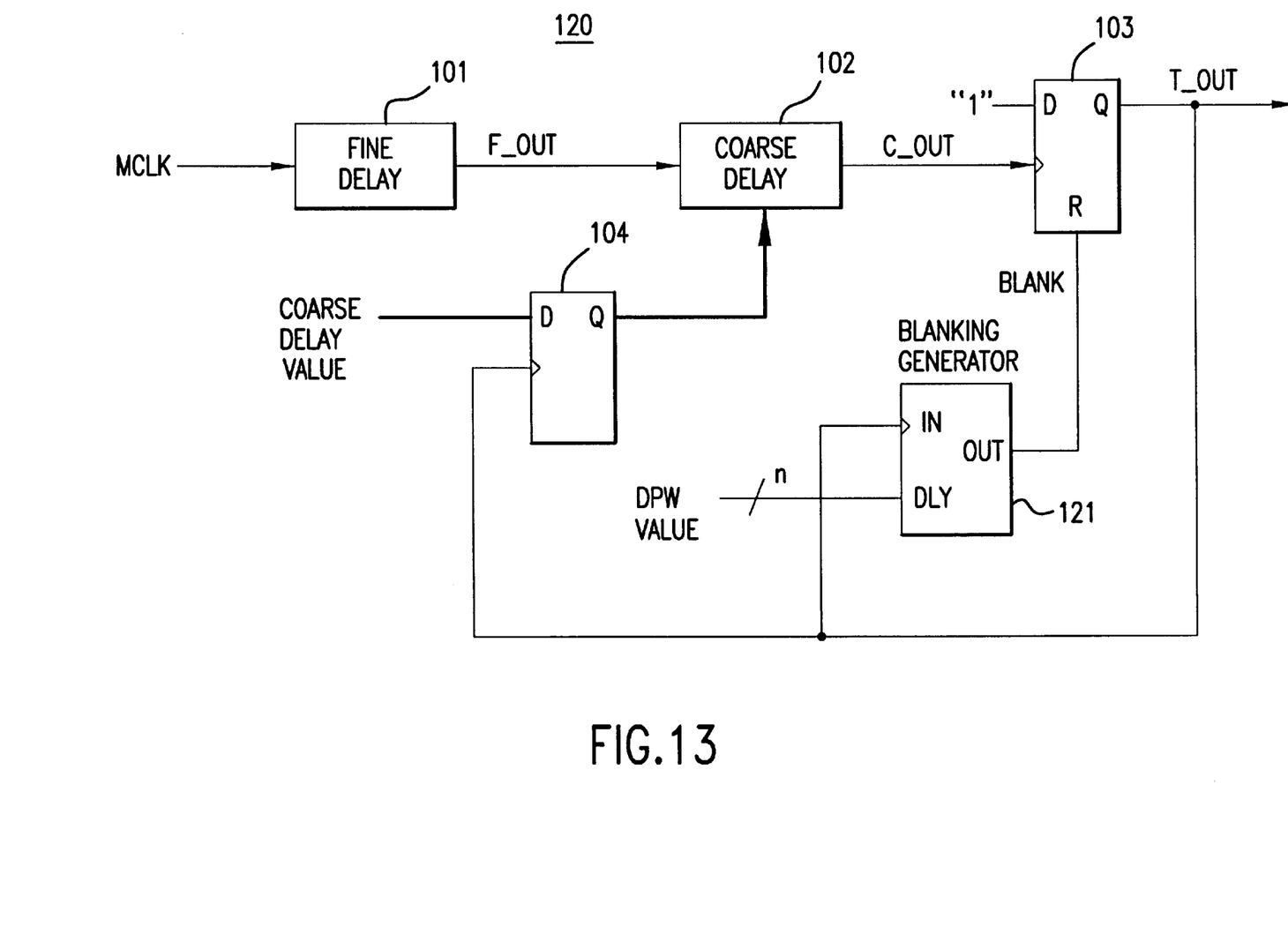
FIG. 13 is a diagram of an improved coarse delay circuit including a blanking generator.
Figure 14:
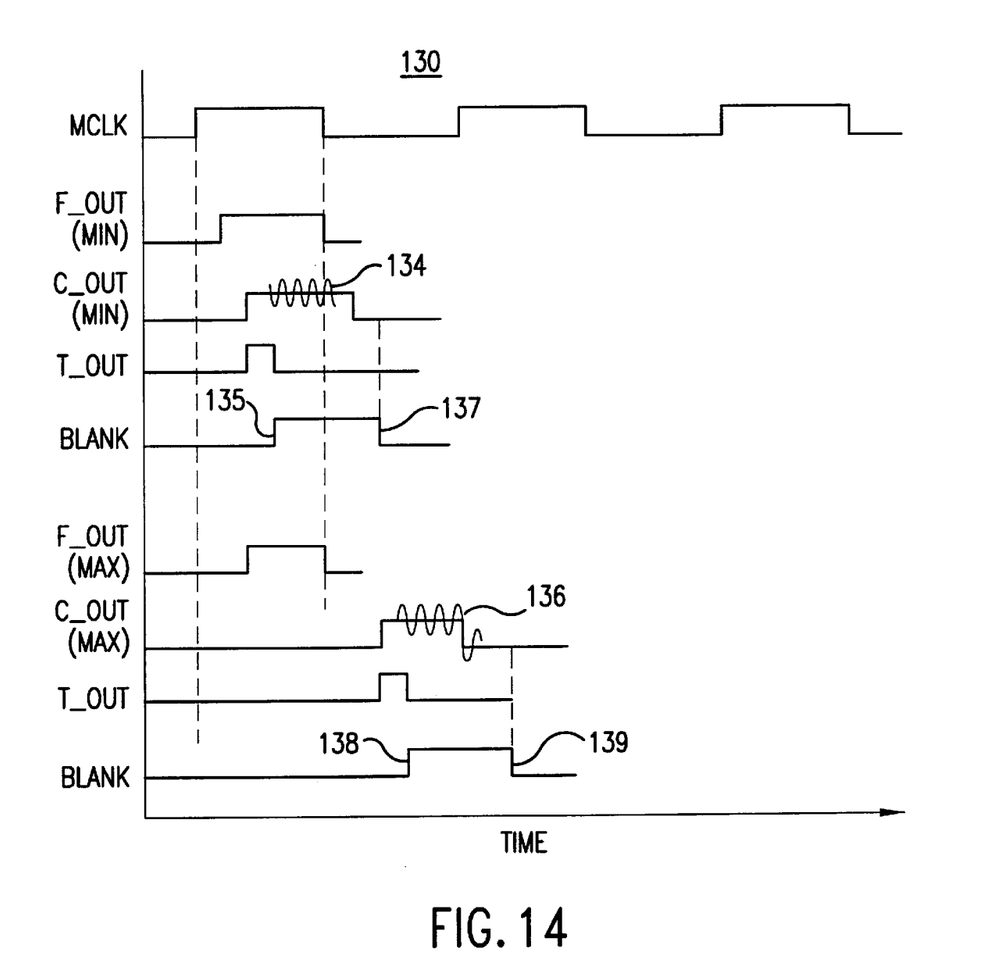
FIG. 14 is a timing diagram for the coarse delay circuit shown in FIG. 13.

An embodiment consistent with the present invention solves the above limitation, as shown in FIG. 13, by adding an asynchronous, variable pulse width blanking signal generator 121 to a coarse delay output circuit 120. Blanking signal generator 121 has a pulse width controlled by a digital control bus "DPW." The digital pulse width via the DPW bus control allows the pulse width to be custom-tuned to IC process, operating voltage, and operating temperature. Blanking signal generator 121 produces an adjustable blanking signal for use in blanking transients. FIG. 14 shows a timing diagram 130, illustrating that for both minimum (points 135 to 137) and maximum (points 138 to 139) delay extremes the blanking signal width remains the same and effectively blanks reprogramming transients 134 and 136.

Figure 15:
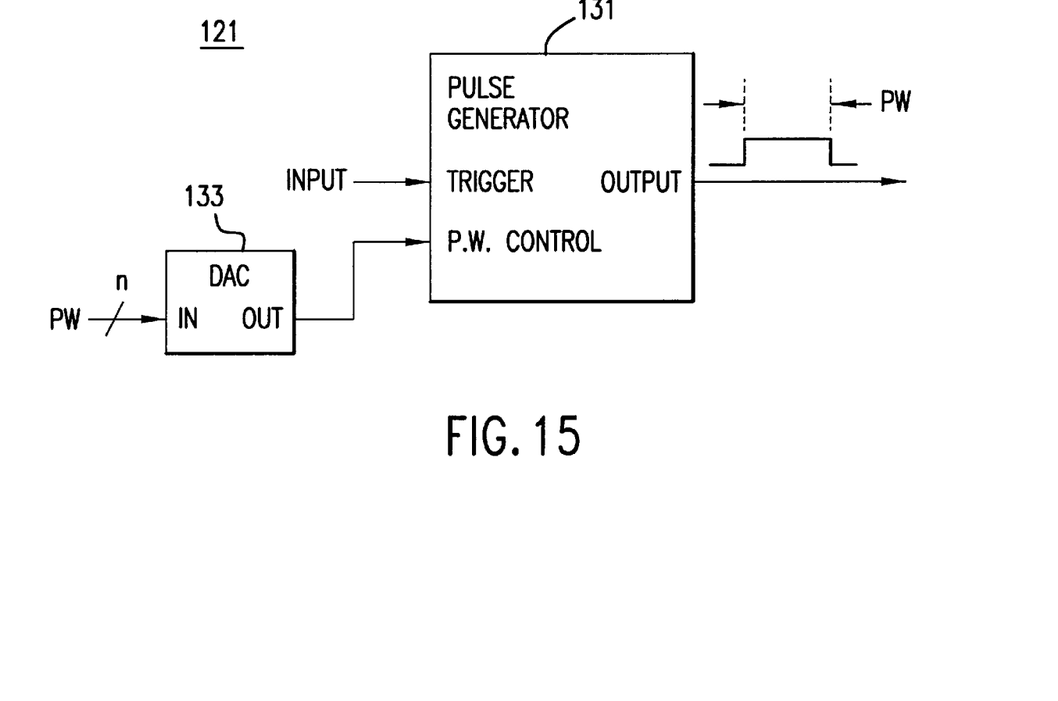
FIG. 15 is a diagram of the blanking generator shown in FIG: 13.

Blanking generator circuit 121 can be implemented, for example, with an adjustable pulse width, edge triggered monostable multi-vibrator. FIG. 15 is a diagram of an exemplary implementation of blanking generator circuit 121. Blanking generator circuit 121 in this example includes a pulse generator 131 that generates an output pulse of width "PW" when triggered by the INPUT signal. The width of the pulse PW is controlled by an analog input referred to as "P.W. CONTROL". Signal P.W. CONTROL is generated from a digital control value of data width "n" bits wide. The digital control is applied to a logical digital-to-analog (DAC) converter 133 that generates the analog control signal (P.W. CONTROL).

A "logical DAC" refers to any circuit component or collection of components that performs the function of controlling the pulse width of a monostable multi-vibrator for this exemplary implementation. That function can be implemented in a variety of ways. For example, in one implementation a current source charges a bank of capacitors connected to the input of a voltage comparator. Different numbers of capacitors are connected via the digital control bus to change the time to reach a specified voltage that cause the comparator to "fire." This current source is controlled by a digital value, four bits in this implementation, that programs a current DAC.

Figure 16:
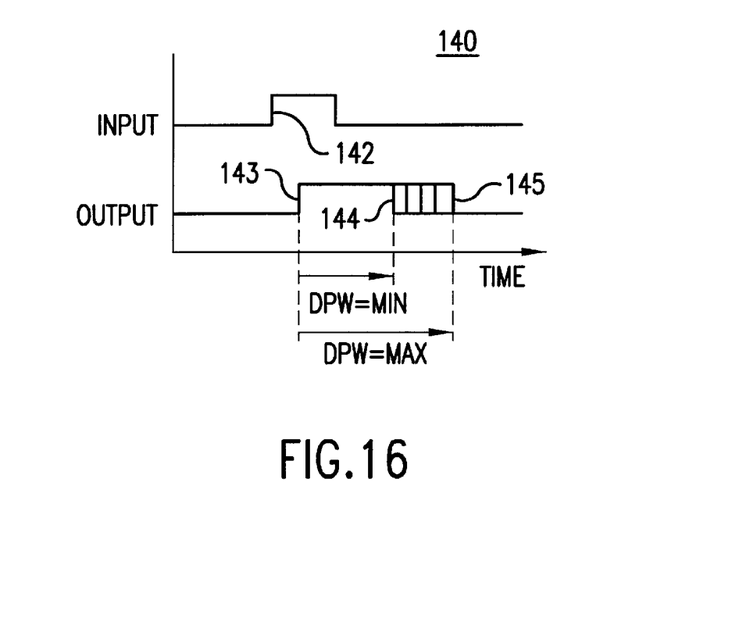
FIG. 16 is a timing diagram for the blanking generator shown in FIG. 15.

FIG. 16 illustrates waveforms 140 for the operation of blanking generator circuit 121. The rising edge of input signal IN for blanking generator 121 at point 142 forces the output signal OUT of blanking generator 121 to go high at point 143 for a length of time determined by the digital control value of the DPW bus. The output pulse width is adjustable over a range, varying from points 143 to 144 and from points 143 to 145. The addition of blanking generator circuit 121 thus allows the coarse delay line transients to be completely blanked independent of the coarse delay line programmed delay and without relying on the external system clock (MCLK).

The various embodiments described above can be implemented with any components providing the described functions, or as shown in the corresponding timing diagrams. The circuit components provided for the embodiments are only examples of such implementations. The latches can be implemented, for example, with flip-flops, registers, or other types of circuits for storing and outputting states of an input signal. The logic gates can be implemented with conventional logic gates as identified by the circuit components or with any component providing the function of the corresponding logic gate. The blanking circuits can be implemented, for example, with the components shown and described, or with any components for providing the same or equivalent functions of the circuits. Also, the embodiments can be used with different types of ENABLE signals and delay line signals, and with various types of delay stages and lines.

While the present invention has been described in connection with an exemplary embodiment, it will be understood that many modifications will be readily apparent to those skilled in the art, and this application is intended to cover any adaptations or variations thereof. For example, different types of circuit components and labels for the various signals may be used without departing from the scope of the invention. This invention should be limited only by the claims and equivalents thereof.

What is claimed is:

1. A circuit for split fine and course delay control of delay lines for use in loading delay data, comprising:
   a fine delay, controlled by a fine delay line, receiving a clock signal and outputting a fine delay signal;
   a coarse delay, controlled by a coarse delay line, receiving the fine delay signal and outputting a coarse delay signal;
   gating logic receiving the coarse delay signal and outputting a gated delay signal for loading delay data; and
   a latch, clocked by the fine delay signal, receiving the fine delay line and outputting a programmable control signal for the fine delay.

2. The circuit of claim 1 wherein the coarse delay comprises a programmable delay line.

3. The circuit of claim 2 wherein the fine delay comprises a programmable delay line capable of producing shorter time delays than the coarse delay.

4. The circuit of claim 1 wherein the gating logic includes a circuit for blanking transient signals in the coarse delay signal.

5. A circuit for split fine and course delay control of delay lines for use in loading delay data, comprising:
   a fine delay, controlled by a fine delay line, receiving a clock signal and outputting a fine delay signal;
   a coarse delay, controlled by a coarse delay line, receiving the fine delay signal and outputting a coarse delay signal;
   gating logic receiving the coarse delay signal and outputting a gated delay signal for loading delay data; and
   a latch, clocked by the gated delay signal, receiving the coarse delay line and outputting a programmable control signal for the coarse delay.

6. The circuit of claim 5 wherein the coarse delay comprises a programmable delay line.

7. The circuit of claim 6 wherein the fine delay comprises a programmable delay line capable of producing shorter time delays than the coarse delay.

8. The circuit of claim 5 wherein the gating logic includes a circuit for blanking transient signals in the coarse delay signal.

9. A polarity blanking delay circuit for blanking transients for use in loading delay data, comprising:
   a delay, controlled by a delay line, receiving a clock signal and outputting a first delay signal;
   a latch, clocked by the first delay signal, receiving an input signal and outputting a second delay signal; and
   a blanking circuit receiving the clock signal and a control signal, and outputting a blanking signal to a control input of the latch for use in blanking transients in the first delay signal.

10. The circuit of claim 9 wherein the blanking circuit includes a synchronous state machine clocked by the clock signal.

11. The circuit of claim 10 wherein the synchronous state machine includes:
    a pair of latches clocked by the clock signal and gated by a control signal;
    a plurality of logic gates receiving outputs of the pair of latches and outputting the blanking signal.

12. The circuit of claim 9, further including a logic gate receiving a master clock signal and the control signal, and outputting the clock signal.

13. The circuit of claim 9, further including a logic gate receiving the clock signal and the blanking signal, and outputting a gating signal to the control terminal of the latch.

14. The circuit of claim 9 wherein the latch comprises a flip-flop.

15. A circuit providing adjustable blanking of transients for use during loading of delay data, comprising:
- a fine delay receiving a clock signal and outputting a fine delay signal;
- a coarse delay, controlled by a coarse delay line, receiving the fine delay signal and outputting a coarse delay signal;
- a latch, clocked by the coarse delay signal, receiving an input signal and outputting a delayed clock signal; and
- a blanking generator receiving a control signal and outputting an adjustable blanking signal to a control terminal of the latch for use in blanking transients in the delayed clock signal.

16. The circuit of claim 15 wherein the latch comprises a flip-flop.

17. The circuit of claim 15 wherein the blanking generator includes an asynchronous circuit generating a variable pulse width based upon a received digital control value.

18. The circuit of claim 15, further including a coarse delay latch, clocked by the delayed clock signal, receiving the coarse delay line and outputting a programmable control signal to the coarse delay.

19. The circuit of claim 15 wherein the blanking generator includes an adjustable pulse width edge triggered monostable multi-vibrator.

20. The circuit of claim 15 wherein the blanking generator includes:
- a logical digital-to-analog converter receiving a digital control value and producing a corresponding analog control signal; and
- a pulse generator receiving the analog control signal and producing an output pulse having a width determined by the corresponding analog control signal.

21. The circuit of claim 15 wherein the coarse delay comprises a programmable delay line.

22. The circuit of claim 21 wherein the fine delay comprises a programmable delay line capable of producing shorter time delays than the coarse delay.

* * * * *